(12) United States Patent
Idouji

(10) Patent No.: US 6,683,647 B2
(45) Date of Patent: Jan. 27, 2004

(54) METHOD FOR DRIVING SOLID-STATE IMAGE SENSING DEVICE

(75) Inventor: Takashi Idouji, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/036,907

(22) Filed: Dec. 21, 2001

(65) Prior Publication Data
US 2002/0105587 A1 Aug. 8, 2002

(30) Foreign Application Priority Data
Dec. 25, 2000 (JP) ..................... P2000-391742

(51) Int. Cl.⁷ .................... H04N 3/14; H04N 5/335
(52) U.S. Cl. ............. 348/312; 348/324; 348/322; 377/63
(58) Field of Search ................ 348/324, 322, 348/312; 377/63, 58

(56) References Cited
U.S. PATENT DOCUMENTS

| | | | | |
|---|---|---|---|---|
| 3,758,794 A | * | 9/1973 | Kosonocky | 257/236 |
| 3,955,100 A | * | 5/1976 | Takahashi et al. | 327/113 |
| 4,112,456 A | * | 9/1978 | Lampe et al. | 257/214 |
| 4,554,675 A | * | 11/1985 | Miwada | 257/239 |
| 4,583,003 A | * | 4/1986 | Kimata | 257/232 |
| 4,980,771 A | * | 12/1990 | Ueda et al. | 348/312 |
| 5,051,832 A | * | 9/1991 | Losee et al. | 257/232 |
| 5,229,857 A | * | 7/1993 | Taniji | 348/305 |
| 5,847,758 A | * | 12/1998 | Iizuka | 348/280 |
| 6,075,565 A | * | 6/2000 | Tanaka et al. | 257/232 |

* cited by examiner

*Primary Examiner*—Wendy R. Garber
*Assistant Examiner*—James Hannett
(74) *Attorney, Agent, or Firm*—Sonnenschein, Nath & Rosenthal LLP

(57) ABSTRACT

A method for driving a CCD solid-state image sensing device. The method is applied to driving the CCD in order to ensure a sufficiently large charge to be handled. In the method, the driving control is performed such that the length of a control interval, which starts from the point in time when a driving voltage is applied to an electrode terminal having the largest time constant (for example, the electrode having the longest wiring line as viewed from the input side of a driving clock, or the electrode laminated at the lowest layer) is more than the length of the other control intervals subsequent to the control interval. Thus, the influence of delay in the rise time of the driving voltage at the electrode which has the largest time constant is eliminated.

2 Claims, 7 Drawing Sheets

METHOD FOR DRIVING SOLID-STATE IMAGE SENSING DEVICE

RELATED APPLICATION DATA

The present application claims priority to Japanese Application(s) No(s). P2000-391742 filed Dec. 25, 2000, which application(s) is/are incorporated herein by reference to the extent permitted by law.

BACKGROUND OF THE INVENTION

1. Field of the Invention

The present invention relates to a method for driving a solid-state image sensing device, and more particularly, to a method for driving a CCD solid-state image sensing device which is driven by a multiple-phase clock.

2. Description of the Related Art

Hitherto, a typical method for driving a solid-state image sensing device, that is, a method for driving a CCD solid-state image sensing device, generally employs driving control of electrodes with the driving timing shown in FIG. 6.

Electrode terminals V$\phi$1, V$\phi$2, and V$\phi$3 which are shown in FIG. 6 are the terminal names of the electrode terminals connected to three kinds of poly-Si electrodes for forming a packet of V-CCDs (vertical-transfer charge coupled devices).

Also, clock voltage waveforms $\phi$1, $\phi$2, and $\phi$3 are the voltage waveforms which are applied to each of the poly-Si electrodes described above via the above-described electrode terminals V$\phi$1, V$\phi$2, and V$\phi$3.

The amount of charge which can be handled by the V-CCD (hereinafter, referred to as "QV") is determined by the packet size of the V-CCD described above.

FIG. 7 is a timing chart which shows a driving timing of a conventional CCD solid-state image sensing device.

In FIG. 7, symbols A to F show control intervals for forming potential wells in the V-CCD.

The control interval for forming a potential well is defined, more specifically, as an interval indicated by a period of time starting from the state in which three-phase clocks $\phi$1, $\phi$2, and $\phi$3 are applied to the electrode terminals V$\phi$1, V$\phi$2, and V$\phi$3, respectively, while maintaining certain voltage levels, for driving the V-CCD described above via the electrode terminals V$\phi$1, V$\phi$2, and V$\phi$3, to the state when a change occurs (that is, a change occurs in one of the voltage levels of the above-described three-phase clocks $\phi$1, $\phi$2, and $\phi$3).

Hitherto, the length of a control interval (that is, the length of time) for which certain values of the voltage level of the three-phase clocks $\phi$1, $\phi$2, and $\phi$3 are applied to the terminals V$\phi$1, V$\phi$2, and V$\phi$3 is always constant for all the control intervals A to F.

In this regard, as the circumstances regarding CCDs in general, currently, there is a strong demand for a larger number of pixels, and therefore it becomes necessary to miniaturize a unit cell which constitutes a CCD.

However, in the conventional method for driving V-CCDs as shown in the FIG. 6 described above, each control interval has the same length, and the electrode of the CCD which is located at end part has a longer wiring line than the other electrodes based on the structure of the electrode terminal when viewed from the input side of a clock signal at a certain timing, thus a delay occurs in the propagation time of the clock input with that timing.

Also, as shown in FIG. 3, the electrode has a complicated structure in which three kinds of electrodes are laminated with each other.

For this reason, impedance differences occur among the individual electrodes, thereby producing differences in the time constant among the individual electrodes. Consequently, in this case, QV described above is determined by the electrode having the largest time constant: thus there has been a problem in that a large QV cannot be ensured.

Moreover, by miniaturizing the unit cell size as described above, the area of the V-CCD becomes smaller. Thus, in addition, there has been a problem in that a large QV cannot be ensured because of this point.

In this regard, when a large QV is not ensured, the output image appears to have little reality, thereby causing a serious problem in the image quality of the solid-state devices.

SUMMARY OF THE INVENTION

Accordingly, the present invention is made in view of the above-described problems in the conventional method for driving a solid-state image sensing device, and an object is to provide a method for driving a solid-state image sensing device which can ensure handling of a sufficiently large charge.

In order to solve the above-described problem, in the present invention, there is provided a method for driving a solid-state image sensing device in which a plurality of charge coupled devices are arranged on a semiconductor substrate, including: performing control such that the length of a control interval starting from a point in time when a predetermined driving voltage is applied to an electrode having the largest time constant among a plurality of electrodes corresponding to the charge coupled devices is more than the length of any other control interval.

Specifically, in the present invention, in order to eliminate the influence of delay in the rise time of the driving voltage at the electrode which has the largest time constant (for example, an electrode having the longest wiring line as viewed from the input side of the driving clock, or an electrode laminated at the lowest layer) because of the structure of a CCD solid-state image sensing device, driving control is performed such that the length of a control interval (length of time) which starts from a point in time when a driving voltage is applied to the above-described electrode is more than the length of any other control interval. Thus, by setting a time period until the effective swing of the electrode described above is settled within a predetermined fixed value, it is possible to ensure a sufficiently large charge to be handled by the CCDs.

DESCRIPTION OF THE PREFERRED EMBODIMENT

In the following, an embodiment of the present invention will be described with reference to the drawings.

First, a description is given of the structure and the general principle of operation of a CCD included in a solid-state image sensing device.

Figure 1:
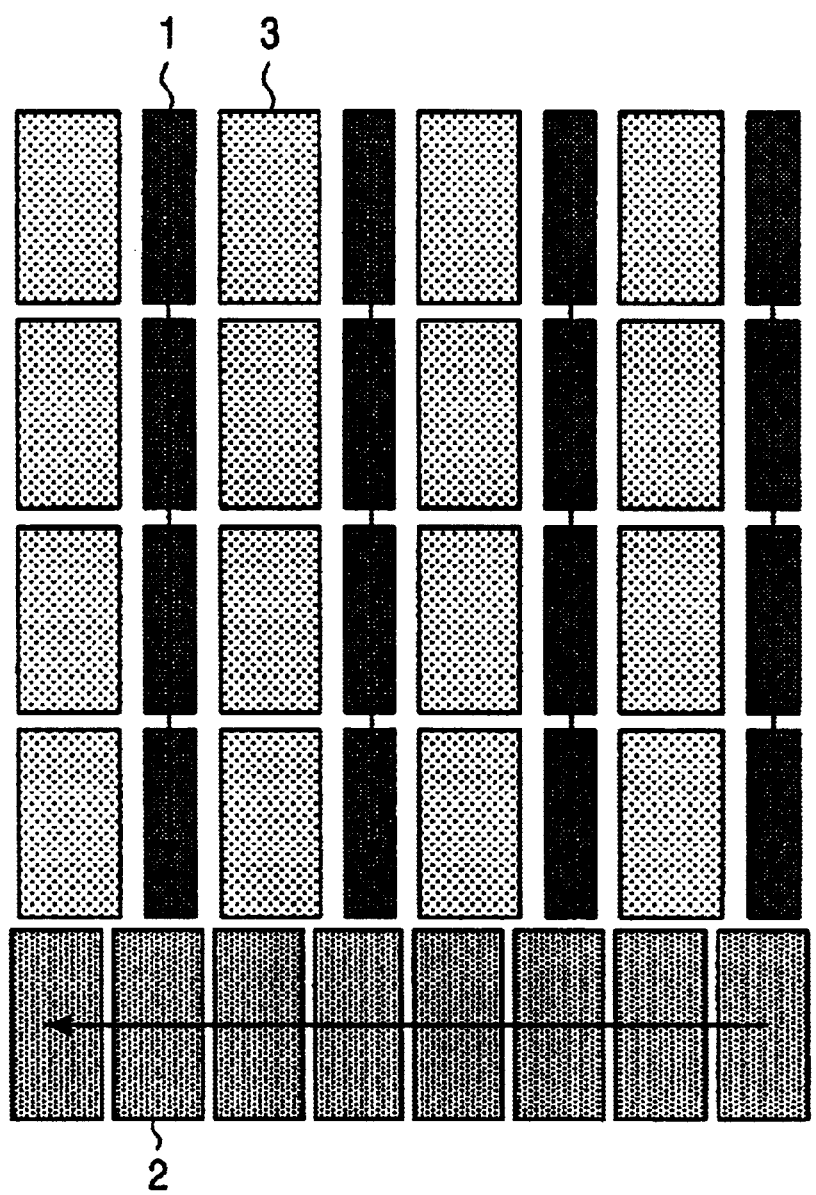
FIG. 1 illustrates the planar structure and the general principle of operation of a CCD included in a solid-state image sensor.

FIG. 1 illustrates the planar structure and the general principle of operation of a CCD included in a solid-state image sensor.

In a solid-state image sensing device as shown in FIG. 1, photo-diodes 3 are arranged in a matrix, and between the columns of photo-diodes 3, vertical-transfer CCDs 1 are arranged, and horizontal-transfer CCDs 2 are arranged at one edge of the vertical-transfer CCDs 1.

The vertical-transfer CCDs 1 transfer charge is generated corresponding to the strength of light in each photo-diode 3 in the vertical direction with a predetermined timing. The horizontal-transfer CCDs 2 receive the transferred charge, and then transfer it in the horizontal direction with a predetermined timing.

Figure 2A:
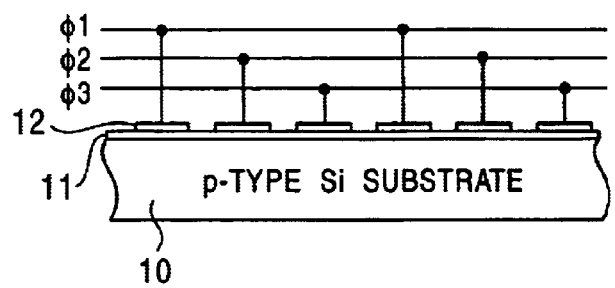
FIGS. 2A, 2B, and 2C illustrate the cross-sectional structure and the general principle of operation of a CCD included in a solid-state image sensor.
Figure 2B:
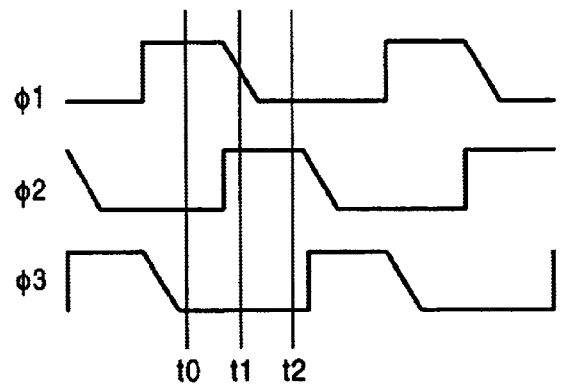
Figure 2C:
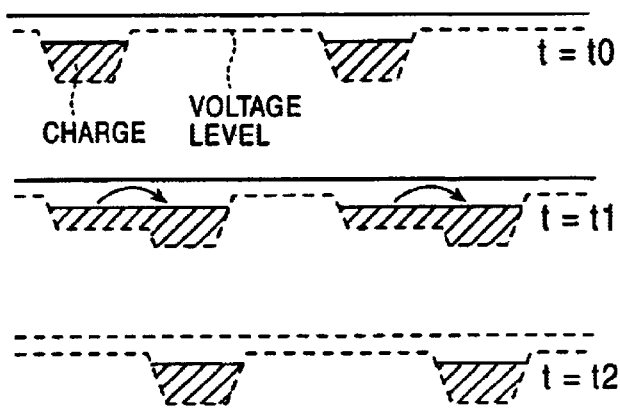

FIGS. 2A, 2B, and 2C illustrate the cross-sectional structure and the general principle of operation of the CCD included in the solid-state image sensor.

FIG. 2A illustrates the structure of the CCD, and FIGS. 2B and 2C illustrate the principle of operation of three-phase CCD driving.

In FIG. 2A, on a p-type Si substrate forming a semiconductor substrate 10, a plurality of electrodes 12, three of which constitute a group, are arranged adjacent to each other at equally spaced intervals, sandwiching a thin oxide film 11. Three kinds of wiring lines, which are driven by three-phase clocks $\phi1$, $\phi2$, and $\phi3$, respectively, are connected to the group of electrodes 12, three of which constitute a group.

As shown in the upper part of FIG. 2C, at time t=0, a potential well is formed just under the electrode which is driven by the clock $\phi1$, and a few carriers are stored there.

Next, as shown in the middle and lower parts of FIG. 2C, from the time t1 to the time t2, the stored charge described above is transferred to the location just under the electrode which is driven by the clock $\phi2$.

In this way, by applying the three-phase clocks $\phi1$, $\phi2$, and $\phi3$ with the timing shown in FIG. 2B, the charge can be sequentially transferred.

Figure 3:
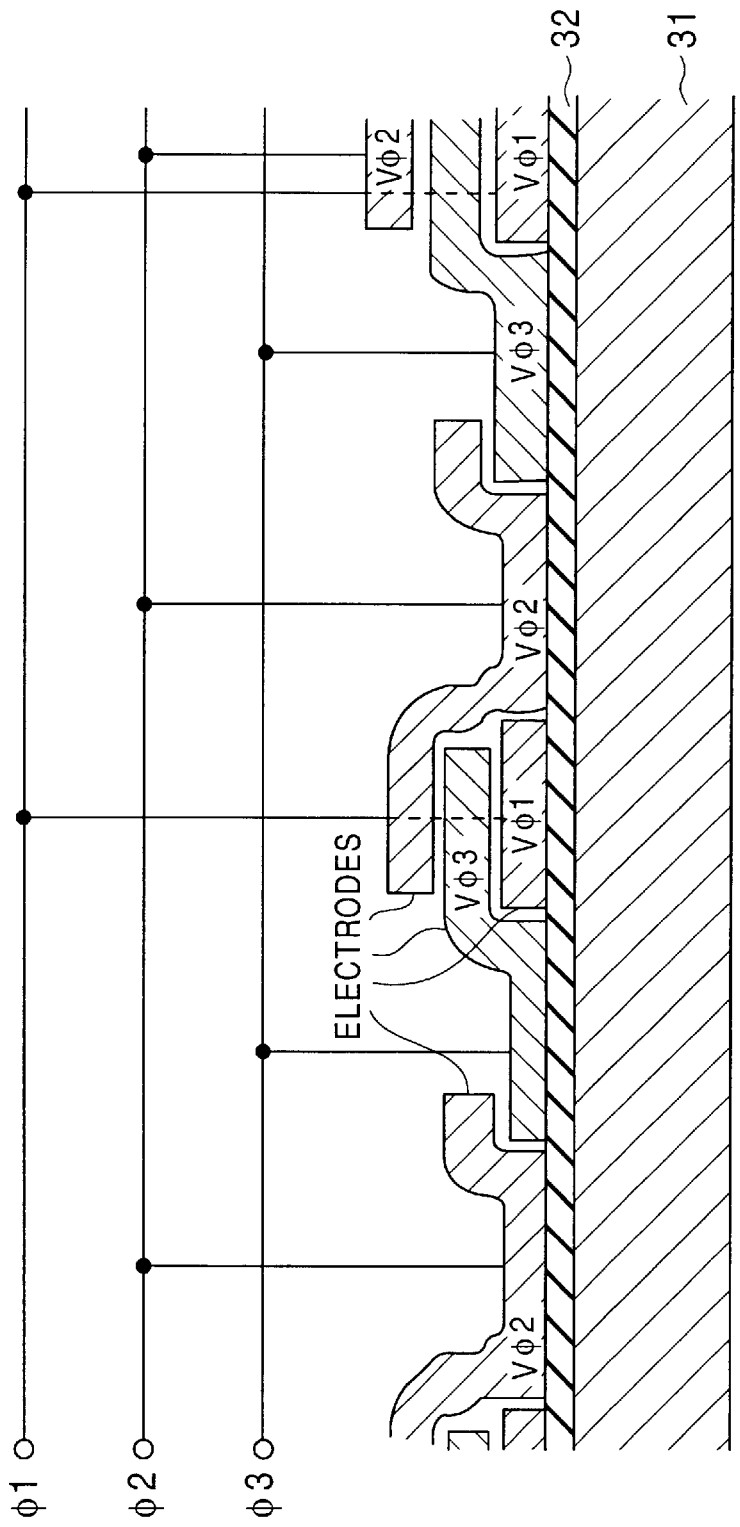
FIG. 3 is a cross-sectional view of the structure of the V-CCD included in a solid-state image sensor according to the present invention.

FIG. 3 is a cross-sectional view of the structure of a V-CCD included in a solid-state image sensor according to the present invention.

On a semiconductor substrate 31, three kinds of electrodes, which are illustrated as a first electrode layer (V$\phi1$), a second electrode layer (V$\phi2$), and a third electrode layer (V$\phi3$), are formed in a laminated manner, sandwiching an oxide film.

In this regard, the above-described symbols (V$\phi1$), (V$\phi2$), and (V$\phi3$) denote the electrodes which are connected to the electrode terminals V$\phi1$, V$\phi2$, and V$\phi3$, respectively.

The three kinds of electrodes described above have a complicated structure, that is, they are laminated with each other, and therefore differences in impedance occur among the electrodes, thereby causing differences in the time constant among the electrodes.

Figure 4:
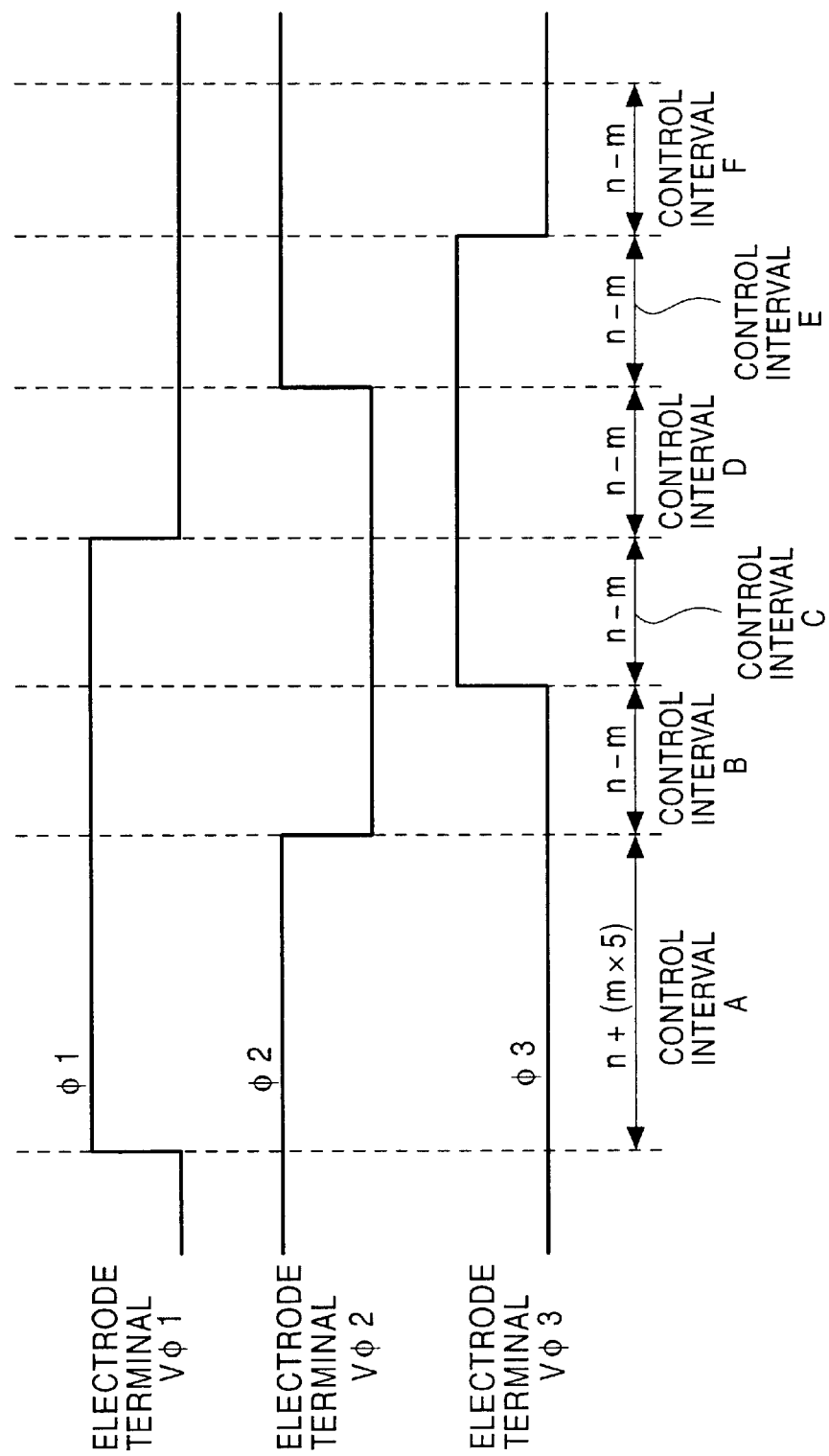
FIG. 4 is a timing chart which shows the driving timing of the V-CCD of the solid-state image sensor according to an embodiment of the present invention.

FIG. 4 is a timing chart which shows the driving timing of the V-CCD of the solid-state image sensor according to the embodiment of the present invention.

In FIG. 4, the symbols V$\phi1$, V$\phi2$, and V$\phi3$ are terminal names of the electrode terminals which are connected to poly-Si electrodes for forming a V-CCD packet according to the present embodiment. Also, the symbols A to F denote control intervals for forming potential wells in which charge is stored.

Also in the present embodiment, in the following, in the same manner as before, the control interval is defined as an interval indicated by a period of time starting from the state in which three-phase clocks $\phi1$, $\phi2$, and $\phi3$ are applied to the electrode terminals V$\phi1$, V$\phi2$, and V$\phi3$, respectively, while maintaining certain voltage levels, for driving the V-CCD described above, to the state when a change occurs (that is, a change occurs in one of the voltage levels of the above-described three-phase clocks $\phi1$, $\phi2$, and $\phi3$).

Here, the control interval A is a control interval starting from the point of time when $\phi1$, which is applied to the first electrode layer (V$\phi1$), rises, and the first electrode layer (V$\phi1$) has a long wiring line, and is laminated at the lowest level, thereby having the largest time constant.

In addition, in FIG. 4, the voltage waveforms of the clocks $\phi1$, $\phi2$, and $\phi3$, which are illustrated corresponding to the electrode terminals V$\phi1$, V$\phi2$, and V$\phi3$, indicate the voltage waveforms which are applied to the poly-Si electrodes connected to the electrode terminals V$\phi1$, V$\phi2$, and V$\phi3$, in order to transfer the charge stored in the potential wells just under the poly-Si electrodes.

Figure 7:
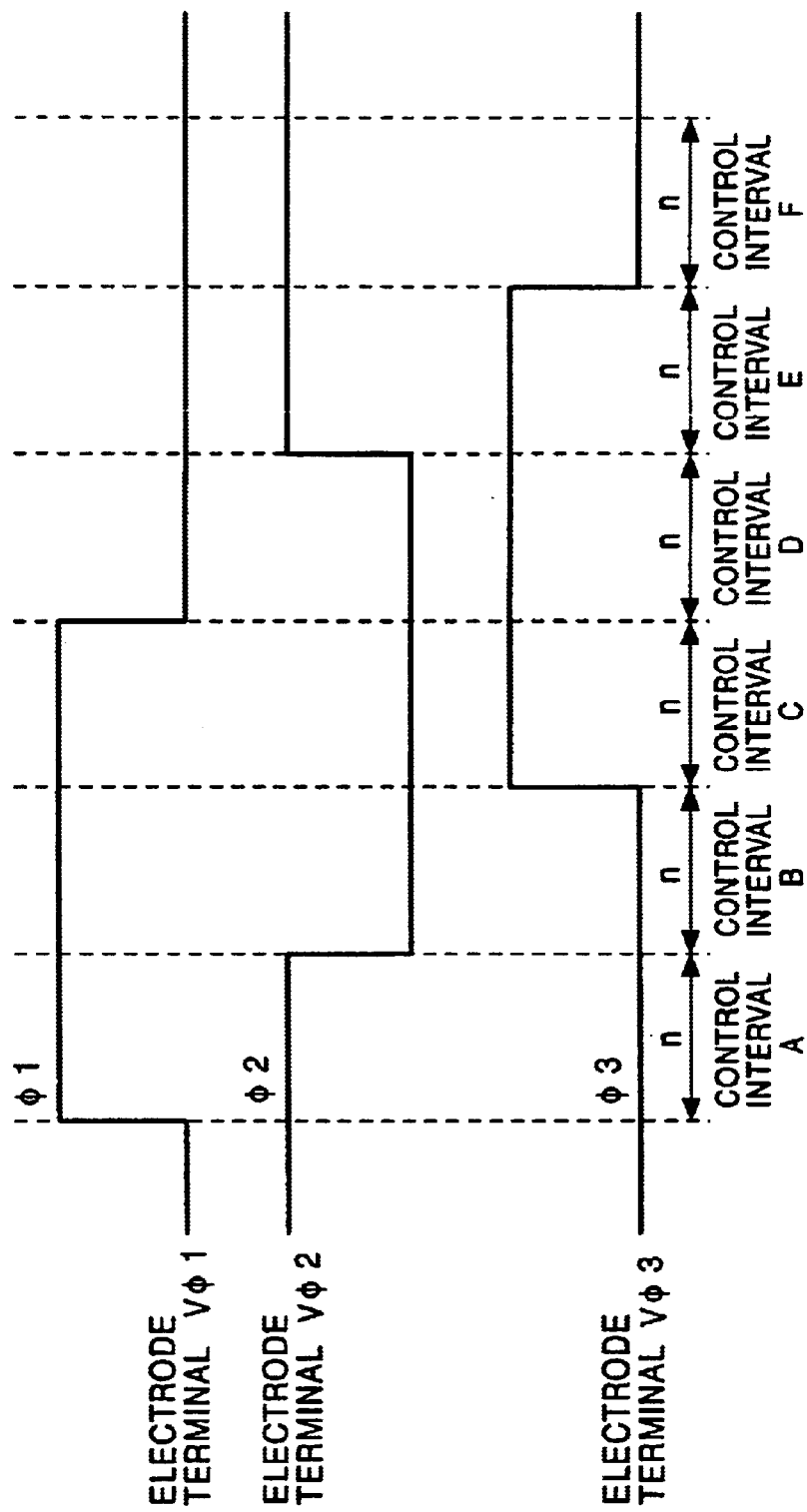
FIG. 7 is a timing chart which shows the driving timing of the conventional CCD solid-state image sensing device.

In the driving timing of the V-CCD of a conventional solid-state image sensing device, as shown in FIG. 7, the length of all the control intervals is the same. However, in the driving timing of the V-CCD of a solid-state image sensing device according to the present embodiment, the length (the length of time) of the control interval A is set to (n+(m×5)), and each length of the control intervals B to F are set to (n−m). This means that the driving control is performed such that the length of the control interval A is more than the lengths of each of the other control intervals B to F.

Figure 5:
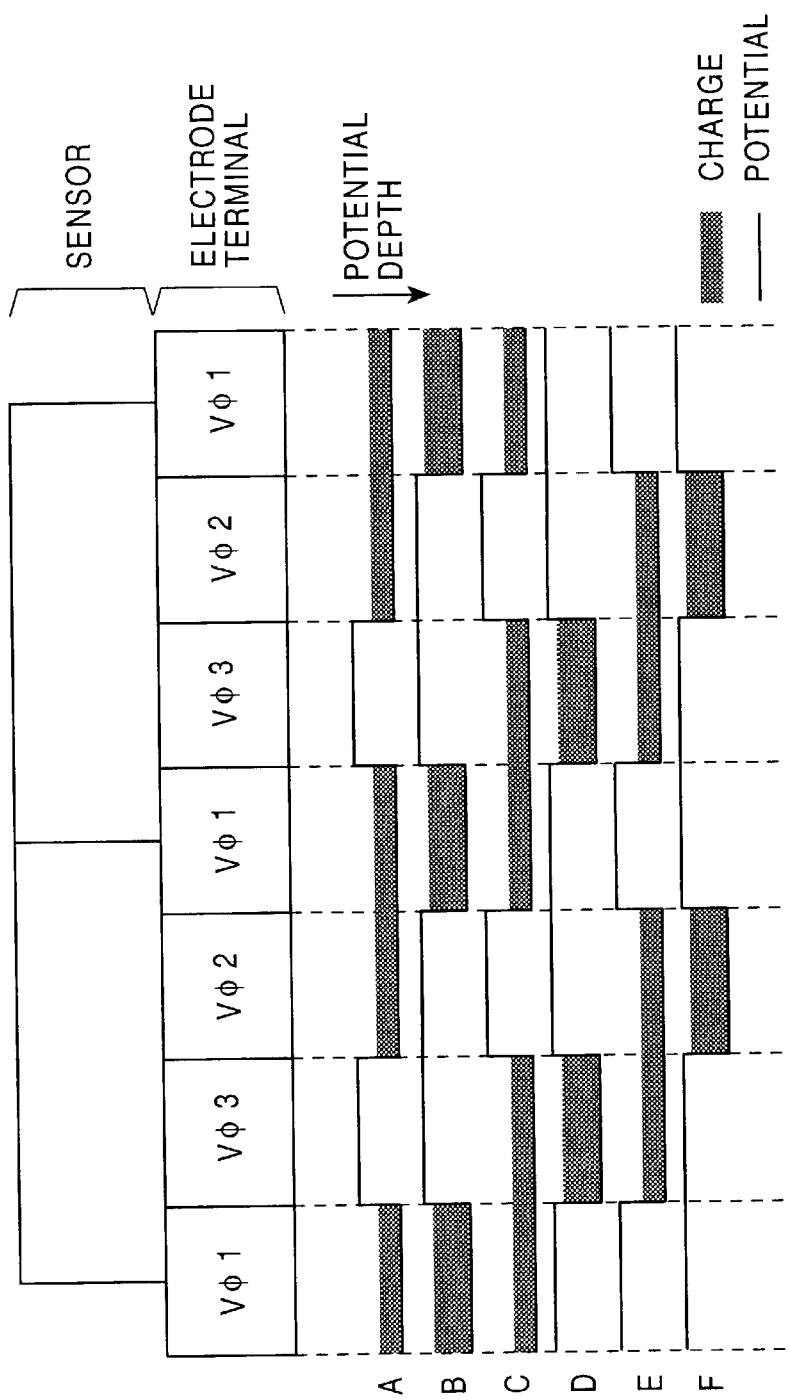
FIG. 5 illustrates the potential depth in a packet for each driving timing of the solid-state image sensing device according to the embodiment of the present invention.
Figure 6:
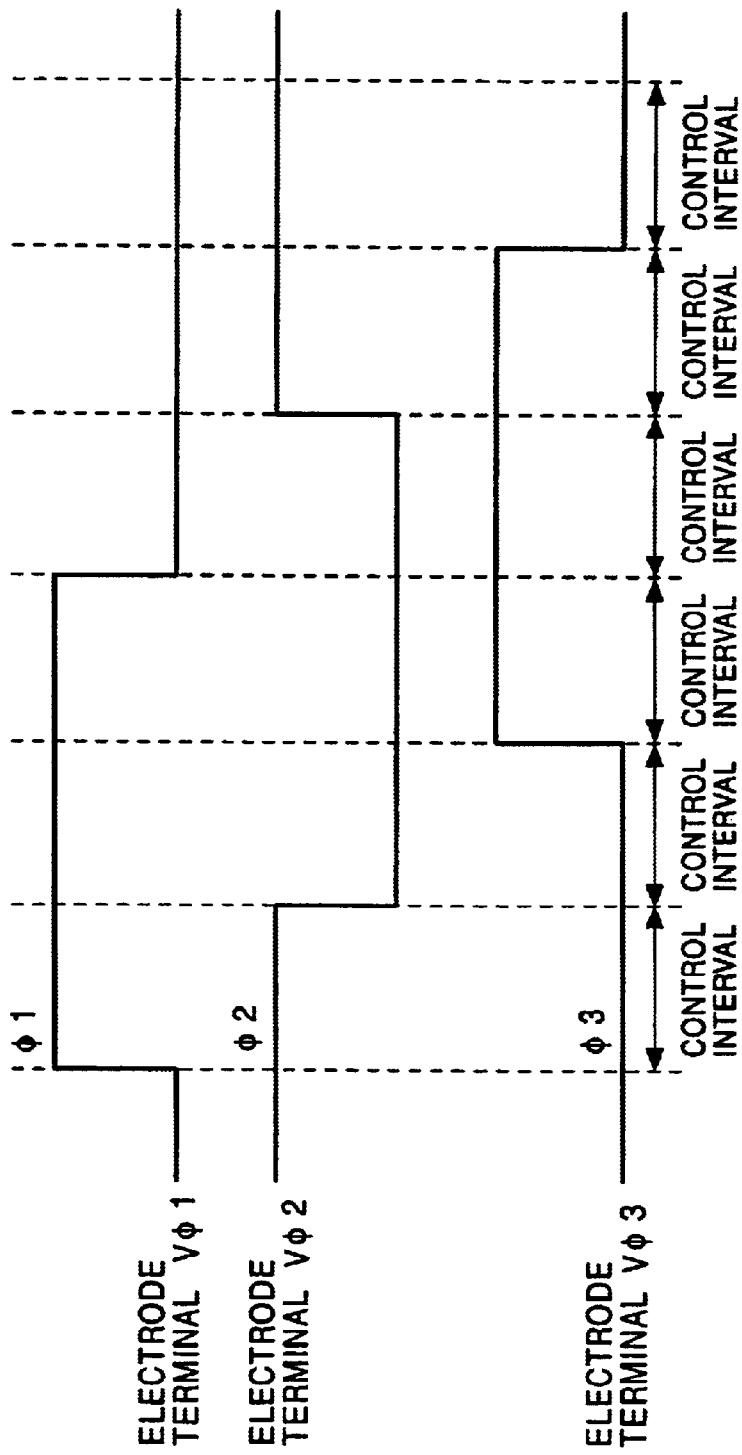
FIG. 6 is a timing chart which shows a general method for driving a conventional CCD solid-state image sensing device.

FIG. 5 illustrates the potential depth in a packet for each driving timing of the solid-state image sensing device according to the embodiment of the present invention.

In FIG. 5, the meaning of each symbol is the same as in FIG. 4, however, in FIG. 5, for each combination of each electrode and control interval, each potential depth which is formed in each corresponding packet is illustrated.

In the following, the principle of the driving timing of a solid-state image sensing device according to the present invention, as shown in FIG. 4, will be described with reference to FIG. 5.

Reference to FIG. 5 reveals that the minimum packet size when transferring charge occurs during three control intervals, that is, B, D, and F.

Here, because of the structure of the V-CCD described above, the electrode which is connected to the electrode terminal V$\phi1$ has the largest time constant, thus it takes a long time until the applied voltage rises to a predetermined value. Accordingly, if the voltage applied to the electrode connected to the electrode terminal V$\phi2$ rises to a predetermined value when the effective swing of the electrode connected to the electrode terminal V$\phi1$ is still low, the control interval B forms the smallest packet among the control intervals B, D, and F.

Then, as shown in FIG. 4, by performing the driving control such that the length of the control interval A is larger than the length of the other control intervals, a sufficient time is ensured until the effective swing of V$\phi1$ becomes a predetermined fixed value.

With the driving timing of this driving method, after the voltage waveform applied to the electrode connected to the electrode terminal V$\phi$1 rises completely, the voltage waveform applied to the electrode connected to the electrode terminal V$\phi$2 rises, thus QV described above can have a large value.

In the following, factors concerning the determination of the length of the control interval A, as shown in FIG. 4, are considered.

First, by considering the factors which determine QV, including timing, the factors are identified as the length of the control interval A and the length of each of the control intervals B to F. This means that QV is determined by the balance between the two.

If the length of the control interval A is set too large, QV decreases during the control intervals B to F. Also, if the length of each of the control intervals A to F is set as a constant amount n, as in the conventional method shown in FIG. 7, QV is determined by the length (=n) of the control interval A.

In this regard, as one example, given that the length of each of the control interval of the V-CCD of the conventional solid-state image sensing device shown in FIG. 7 is n (=84/6), in the driving timing of the solid-state image sensing device according to the present embodiment, the length of the control interval A can be set to 19, and the length of each of the remaining control intervals is set to (84−19)/5=13.

Here, when the time constant of V$\phi$1 is large, it is necessary to set the length of the control interval A to a correspondingly large value; however, if the time constant of the electrode connected to the electrode terminal V$\phi$1 can be made small by improving the design, manufacturing technology, and so on, the length of the control interval A can be set to a small value.

In this regard, in the present embodiment described above, a description is given by limiting the CCD sensor included in a solid-state image sensing device to a V-CCD; however, in general, the control method according to the present embodiment can be applied to any other CCD, and is not limited only to V-CCDs.

Also, in the present embodiment described above, the number of phases of the driving voltage is limited to three, but in general, a driving voltage having any number of phases can be used.

As described above, in the present invention, in order to eliminate the influence of delay in the rise time of the driving voltage at the electrode having the largest time constant, which derives from the structure of a CCD solid-state image sensing device, driving control is performed such that the length of the control interval (length of time), which starts from the point in time when a driving voltage, is applied to the above-described electrode, is more than the length of any other control interval. Thus, by setting the time period until the effective swing of the electrode described above settled to a predetermined fixed value, it is possible to ensure that the CCD can handle a sufficiently large charge.

Also, the present invention can cope with demands for miniaturization and increasing the number of pixels.

Furthermore, the present invention can prevent a decease in the amount of charge which can be handled, which occurs as a result of miniaturization.

What is claimed is:

1. A method for driving a solid-state image sensing device in which a plurality of charge coupled devices are arranged on a semiconductor substrate, comprising:

performing control such that a series of control intervals of different lengths are used and the length of a control interval A starting from a point in time when a predetermined driving voltage is applied to an electrode having the largest time constant among a plurality of electrodes corresponding to said charge coupled devices is more than the length of any other control interval B in the series, wherein, the lengths of control intervals A and B are governed by the relationships Y=n+(m*p) and W=n−m, where Y is the length of control interval A and W is the length of control interval B, p is one less than the total number of intervals, n is the sum of the lengths of all control intervals in the series divided by the total number of control intervals, and m is a positive value.

2. A method for driving a solid-state image sensing device in which a plurality of charge coupled devices are arranged on a semiconductor substrate, comprising:

performing control such that a series of control intervals of different lengths are used and the length of a control interval A starting from a point in time when a predetermined driving voltage is applied to an electrode having the largest time constant among a plurality of electrodes corresponding to said charge coupled devices is more than the length of any other control interval B in the series, wherein, the lengths of control intervals A and B are governed by the relationships Y=n+(m*p) and W=n−m, where Y is the length of control interval A and W is the length of control interval B, p is one less than the total number of intervals, n is the sum of the lengths of all control intervals in the series divided by the total number of control intervals, and m is a positive value, and wherein the length Y of the control interval A is selected such that the accumulated charge does not decrease during the succeeding control intervals in the series.

* * * * *